United States Patent
Brenninger et al.

(10) Patent No.: US 8,357,549 B2
(45) Date of Patent: Jan. 22, 2013

(54) METHOD FOR IDENTIFYING AN INCORRECT POSITION OF A SEMICONDUCTOR WAFER DURING A THERMAL TREATMENT

(75) Inventors: Georg Brenninger, Oberbergkirchen (DE); Konrad Gruendl, Unterneukirchen (DE)

(73) Assignee: Siltronic AG, Munich (DE)

( * ) Notice: Subject to any disclaimer, the term of this patent is extended or adjusted under 35 U.S.C. 154(b) by 365 days.

(21) Appl. No.: 12/692,690

(22) Filed: Jan. 25, 2010

(65) Prior Publication Data

US 2010/0216261 A1    Aug. 26, 2010

(30) Foreign Application Priority Data

Feb. 25, 2009    (DE) .................. 10 2009 010 555

(51) Int. Cl.
*H01L 21/66* (2006.01)
(52) U.S. Cl. ........ 438/14; 438/17; 438/18; 257/E21.521
(58) Field of Classification Search .................. 438/14, 438/17, 18; 257/E21.521
See application file for complete search history.

(56) References Cited

U.S. PATENT DOCUMENTS

| | | | |
|---|---|---|---|
| 6,217,212 B1 | 4/2001 | Brenninger et al. | |
| 6,654,668 B1 | 11/2003 | Harada et al. | |
| 2003/0231950 A1 | 12/2003 | Raaijmakers | |
| 2008/0025368 A1 | 1/2008 | Aderhold et al. | |

FOREIGN PATENT DOCUMENTS

| | | |
|---|---|---|
| JP | 01-209740 | 8/1989 |
| JP | 10-189692 A | 7/1998 |
| JP | 2000-306825 A | 11/2000 |
| JP | 2008-227426 A | 9/2008 |
| WO | 02065510 A1 | 8/2002 |

OTHER PUBLICATIONS

English Translation of Japanese Patent publication JP10189692.*

* cited by examiner

*Primary Examiner* — Julio J Maldonado
*Assistant Examiner* — Amar Movva
(74) *Attorney, Agent, or Firm* — Brooks Kushman P.C.

(57) ABSTRACT

An incorrect position of a semiconductor wafer during thermal treatment in a process chamber heated by means of infrared emitters and transmissive to infrared radiation is identified, wherein the semiconductor wafer lies in a circular pocket of a rotating susceptor and is held at a predetermined temperature with the aid of the infrared emitters and a control system, and wherein thermal radiation is measured by a pyrometer, an amplitude of the fluctuations of the measurement signal is determined and an incorrect position of the semiconductor wafer is assumed if the amplitude exceeds a predetermined maximum value. The pyrometer is oriented such that the measurement spot detected by the pyrometer lies partly on the semiconductor wafer and partly outside the semiconductor wafer on the susceptor so that it is possible to identify an eccentric position of the semiconductor wafer within the pocket of the susceptor.

11 Claims, 3 Drawing Sheets

METHOD FOR IDENTIFYING AN INCORRECT POSITION OF A SEMICONDUCTOR WAFER DURING A THERMAL TREATMENT

CROSS-REFERENCE TO RELATED APPLICATIONS

This application claims priority to German application DE 10 2009 010 555.7 filed Feb. 25, 2009, which is herein incorporated by reference.

BACKGROUND OF THE INVENTION

1. Field of the Invention

The invention relates to a method for identifying an incorrect position of a semiconductor wafer during a thermal treatment in a process chamber which is heated by means of infrared emitters and is transmissive to infrared radiation, wherein the semiconductor wafer lies in a circular pocket of a rotating susceptor and is held at a predetermined temperature with the aid of the infrared emitters and a control system, and wherein thermal radiation is measured by means of a pyrometer, an amplitude of the fluctuations of the measurement signal is determined and an incorrect position of the semiconductor wafer is assumed if the amplitude exceeds a predetermined maximum value.

2. Background Art

A thermal treatment is used for example for the rapid heat treatment of a semiconductor wafer at high temperature ("rapid thermal anneal", RTA, or generally "rapid thermal processing", RTP) or for chemical vapor deposition (CVD), in particular for the deposition of an epitaxial layer on a polished semiconductor wafer.

In this case, the semiconductor wafer generally bears on a support referred to as a susceptor. The susceptor has an edge region and also a pocket lying within the edge region. The depth of the pocket generally corresponds approximately to the thickness of the semiconductor wafer to be treated. During the deposition, the susceptor rotates, and therefore so does the semiconductor wafer lying on it, in order to ensure that the entire wafer surface is treated as homogeneously as possible.

Care must be taken to ensure that the semiconductor wafer lies completely in the pocket of the susceptor during the deposition of an epitaxial layer. A number of possibilities for ascertaining whether this is actually the case is known in the prior art. By way of example, U.S. Pat. No. 6,217,212B1 describes that the signal of a pyrometer directed onto the surface of the semiconductor wafer can be used for this purpose. If the semiconductor wafer is not situated completely in the pocket, then the pyrometer, on account of the vertical wobble and the angular change of the inclined rotating semiconductor wafer, detects a signal oscillating with a relatively high amplitude, the frequency of which corresponds to the rotational frequency of the susceptor. In the case of a semiconductor wafer lying completely in the pocket, by contrast, the amplitude is significantly smaller.

The pocket is generally a few millimeters larger than the semiconductor wafer. WO02/065510A1 teaches that a centered positioning of the semiconductor wafer in the pocket of the susceptor is also important in order to avoid temperature inhomogeneities on the semiconductor wafer. Spacers are offered as a solution, which are intended to ensure that the semiconductor wafer is situated in a defined, centered position in the pocket. This also prevents the semiconductor wafer from floating on the susceptor after placement of the wafer. However, the spacers lead to local turbulences of the process gas, which result in a locally nonuniform thickness of the epitaxial layer in the regions of the semiconductor wafer which adjoin the spacers.

An alternative solution provides for tracking the semiconductor wafer, held by a robot arm by means of an edge gripper, during its transport into the reactor by means of a camera and for comparing its actual position with a predetermined desired position at specific points in time. On the basis of the results of this comparison, the subsequent robot movements are adapted in order to compensate for the deviations ascertained. This is described in US2003/0231950A1. However, this solution has the disadvantage that it exclusively ensures the correct placement of the semiconductor wafer on the generally three pins projecting through the susceptor. When the pins are lowered and the semiconductor wafer is laid onto the susceptor, however, the wafer can still change its position, for example as a result of floating on a gas cushion between susceptor and semiconductor wafer or as a result of vibrations caused by the pins as they are lowered. Incorrect positions of the semiconductor wafer which are attributable to such causes cannot be ascertained in accordance with US2003/0231950A1.

SUMMARY OF THE INVENTION

Therefore, an object of the invention was to determine the actual position of the semiconductor wafer in the pocket of the susceptor in order to be able to ascertain and eliminate faults that possibly occur, and also the causes thereof. These and other objects are achieved by means of a method for identifying an incorrect position of a semiconductor wafer during thermal treatment in a process chamber which is heated by means of infrared emitters and is transmissive to infrared radiation, wherein the semiconductor wafer lies in a circular pocket of a rotating susceptor and is held at a predetermined temperature with the aid of the infrared emitters and a control system, and wherein thermal radiation is measured by means of a pyrometer, an amplitude of the fluctuations of the measurement signal is determined and an incorrect position of the semiconductor wafer is assumed if the amplitude exceeds a predetermined maximum value, wherein the pyrometer is oriented such that the measurement spot detected by the pyrometer lies partly on the semiconductor wafer and partly outside the semiconductor wafer on the susceptor, and wherein the incorrect position is an eccentric position within the pocket of the susceptor. The invention is described in more detail below with reference to the figures.

DETAILED DESCRIPTION OF THE PREFERRED EMBODIMENT(S)

Figure 1:
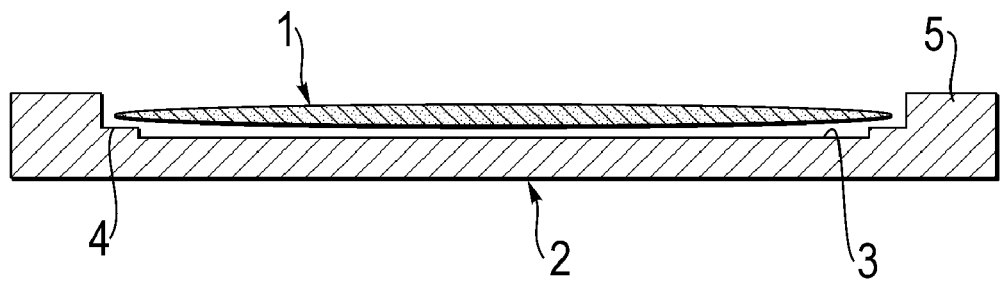
FIG. 1 shows a susceptor with a semiconductor wafer ideally centered in the pocket, in cross section.
Figure 2:
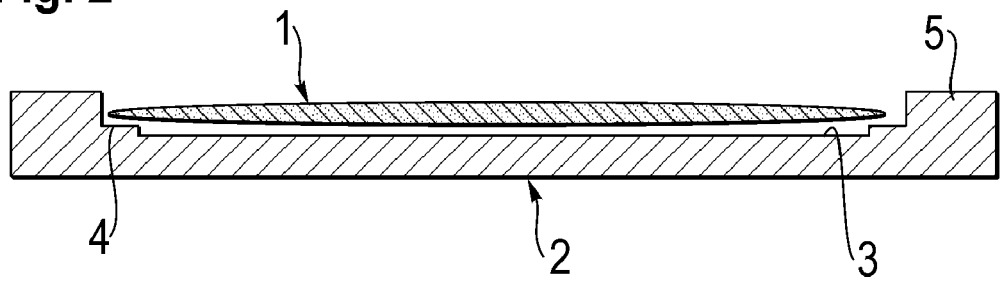
FIG. 2 shows a susceptor with a semiconductor wafer lying eccentrically in the pocket, in cross section.
Figure 4:
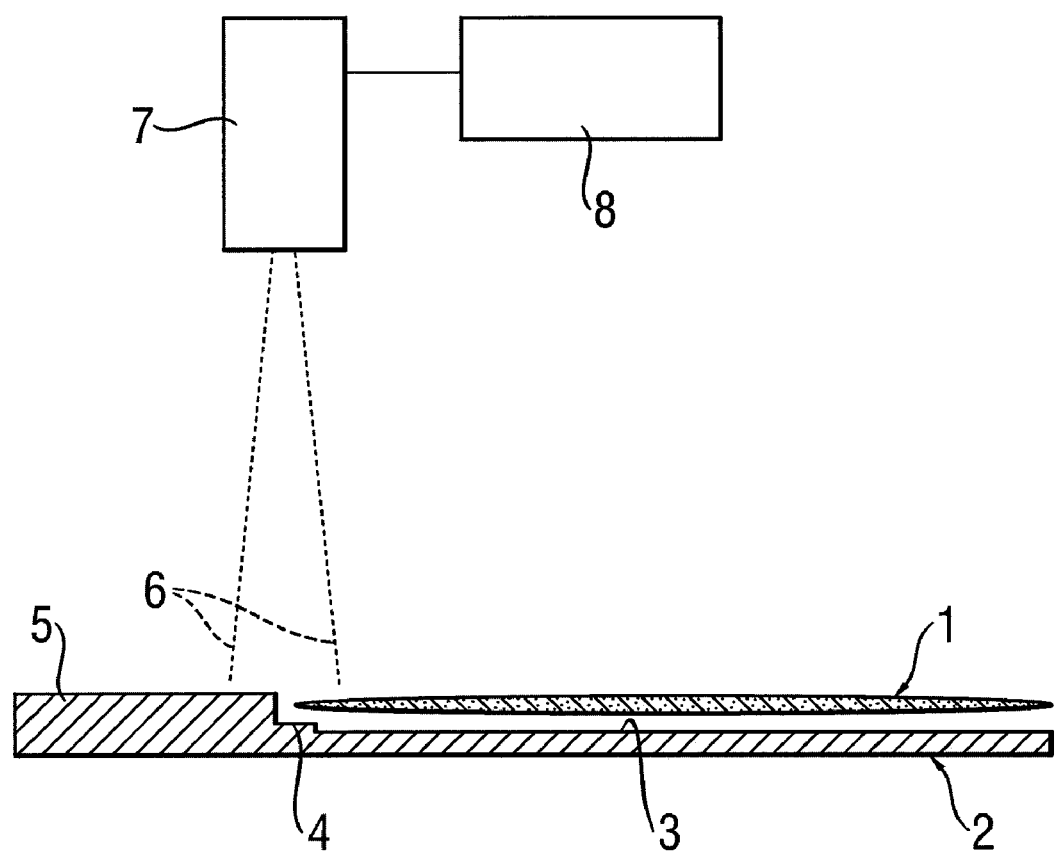
FIG. 4 schematically shows an arrangement for determining according to the invention an incorrect position of a semiconductor wafer.

An apparatus such as is illustrated schematically in FIG. 1 of U.S. Pat. No. 6,217,212B1 can be used for carrying out the method according to the invention. It comprises a chamber (preferably composed of quartz) which can be closed off in a gastight manner, such a chamber being referred to as process chamber hereinafter, with a susceptor. The semiconductor wafer lies horizontally on the susceptor, which rotates about a center axis. In a departure from the illustration in U.S. Pat. No. 6,217,212B1, the susceptor can also be embodied in such a way that the semiconductor wafer is supported by the susceptor only in the edge region, as is illustrated in FIGS. 1, 2 and 4. In this case, the semiconductor wafer 1 bears only with its edge on a ledge 4 in the pocket 3 of the susceptor 2. The pocket 3 is delimited by the edge 5 of the susceptor. The susceptor can also be embodied in such a way that both sides of the semiconductor wafer are freely accessible, for example for coating on both sides. The susceptor is preferably composed of a material which does not contaminate the semiconductor wafer and is not attacked itself under the conditions of the thermal treatment. A susceptor composed of silicon carbide or a graphite susceptor coated with silicon carbide is particularly suitable.

One or a plurality of infrared emitters are arranged outside the process chamber, as illustrated in FIG. 1 of U.S. Pat. No. 6,217,212. The infrared emitters, for example halogen lamps, supply the necessary radiation energy to heat the semiconductor wafer to a desired process temperature, which preferably lies in the range from 600 to 1300° C. The semiconductor wafer is held at a predetermined temperature with the aid of a control device. The control device preferably comprises a temperature sensor, for example a thermoelement or a pyrometer, which measures the temperature of the semiconductor wafer, and a control computer, which compares the measured temperature with a stored desired temperature and, if appropriate, alters the power output of the infrared emitters.

According to the invention, the measurement signal of the pyrometer 7 (see FIG. 4) is used to monitor the position of the semiconductor wafer 1 during the thermal treatment. The pyrometer 7 is generally fitted above the semiconductor wafer 1 outside the process chamber (not illustrated) and permits the determination of the temperature of the measurement spot 6 detected by it by measurement of the radiation output. According to the invention the pyrometer 7 is oriented in such a way that its measurement spot 6 lies partly on the semiconductor wafer 1 and partly outside the semiconductor wafer 1 on the susceptor 2. Therefore, the size of the measurement spot 6 preferably depends on the difference between the diameters of the pocket 3 and of the semiconductor wafer 1. The diameter of the measurement spot 6 preferably corresponds to two to five times, particularly preferably three to four times, the difference between the diameter of the pocket 3 and the diameter of the semiconductor wafer 1. Given a diameter of the pocket 3 of 303 mm and a diameter of the semiconductor wafer 1 of 300 mm, the diameter of the measurement spot 6 is therefore preferably 6-15 mm and more preferably 9-12 mm.

Preferably, the wavelength range of the thermal radiation detected by the pyrometer 7 is defined such that the emissivity of the semiconductor wafer 1 and of the susceptor 2 (depending on the respective material) in this wavelength range is as different as possible. If the semiconductor wafer 1 is composed of silicon and the surface of the susceptor 2 is composed of silicon carbide, then a wavelength range of 0.9 to 1.1 μm is advantageous. In this wavelength range, the susceptor 2 has a significantly higher emissivity than the semiconductor wafer 1. The susceptor 2 therefore appears hotter (at the same temperature) than the semiconductor wafer 1. The larger the proportion of area contributed by the susceptor 2 in the measurement spot 6, the larger the measurement signal of the pyrometer 7 becomes and the higher the apparent temperature not corrected by the different emissivity becomes. The more area the semiconductor wafer 1 contributes, the lower the apparent temperature of the measurement spot 6 becomes.

The measurement spot 6 therefore has to be positioned in such a way that, in the case of a centered position of the semiconductor wafer 1, it lies partly on a semiconductor wafer 1 and partly on the susceptor 2. The measurement spot 6 lies in particular in such a way that 10-90%, preferably 20-60%, and more preferably 30-40%, of the diameter of the measurement spot lies on the semiconductor wafer 1 if a centered position of the semiconductor wafer 1 in the pocket 3 of the susceptor 2 is assumed.

Figure 3:
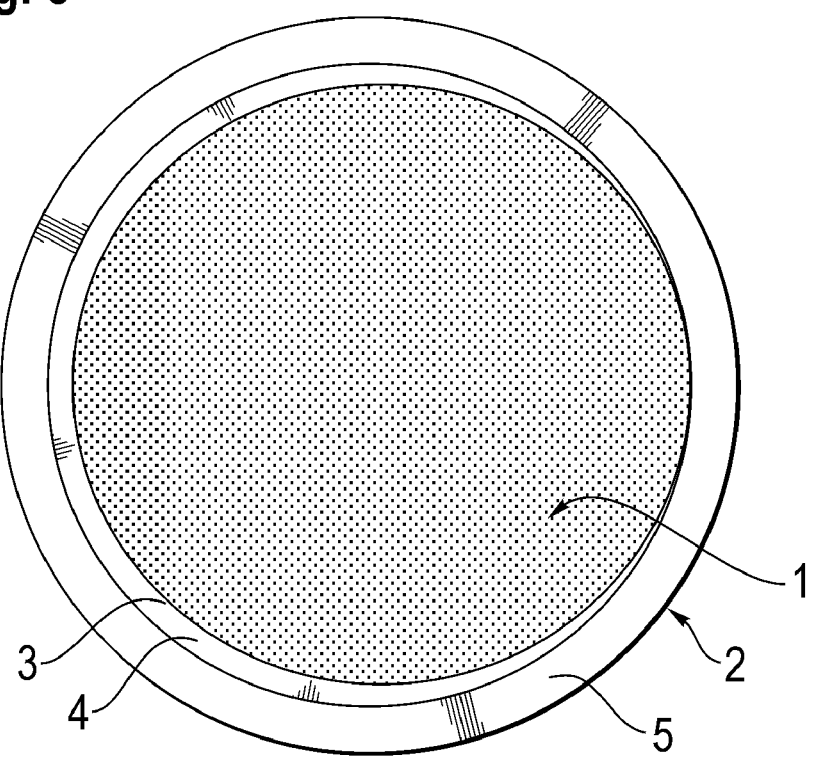
FIG. 3 shows a susceptor with a semiconductor wafer lying eccentrically in the pocket, in plan view.

If the susceptor 2 together with semiconductor wafer 1 then rotates about its own axis, the proportions of area contributed by the susceptor 2 and the semiconductor wafer 1 in the stationary measurement spot 6 change only little if the semiconductor wafer 1 lies centered in the pocket 3, as illustrated in FIG. 1. If, by contrast, the semiconductor wafer 1 lies eccentrically in the pocket 3, the proportions of area contributed by susceptor 2 and semiconductor wafer 1 in the measurement spot 6 change with the rotation. In the extreme case, the semiconductor wafer 1 bears at one side on the edge 5 of the susceptor 2 and at the opposite side is at a maximum distance (corresponding to the difference between the diameter of pocket and semiconductor wafer) from the edge 5 of the susceptor 2, as illustrated in FIGS. 2 and 3. In this case, the proportions of area contributed by susceptor 2 and semiconductor wafer 1 in the measurement spot 6 change maximally with the rotation. If the measurement spot 6 at a specific point in time lies precisely at the location of the maximum distance between semiconductor wafer 1 and edge 5 of the susceptor 2, then the proportion of area contributed by the susceptor 2 in the measurement spot is maximal and amounts to almost 100% if the size and position of the measurement spot were chosen suitably. After a rotation of the susceptor by 180°, in contrast, the measurement spot 6 is situated at the location at which the semiconductor wafer 1 bears on the edge 5 of the susceptor 2. Here the proportion of area contributed by the semiconductor wafer 1 in the measurement spot 6 is maximal and amounts to approximately 50%, for example.

Since the emissivity of the susceptor, as described above, deviates from that of the semiconductor wafer, the rotation of the susceptor and of the semiconductor wafer lying thereon leads to an oscillating measurement signal of the pyrometer, the amplitude of which signal depends on how eccentrically the semiconductor wafer lies in the pocket of the susceptor. Therefore, the temporal profile of the measurement signal generated by the pyrometer is evaluated according to the invention. If this evaluation yields a relatively small fluctuation of the measurement signal, then the semiconductor wafer is positioned in a manner centered in the pocket. A maximum amplitude is achieved if the semiconductor wafer bears on the edge of the susceptor.

Figure 5:
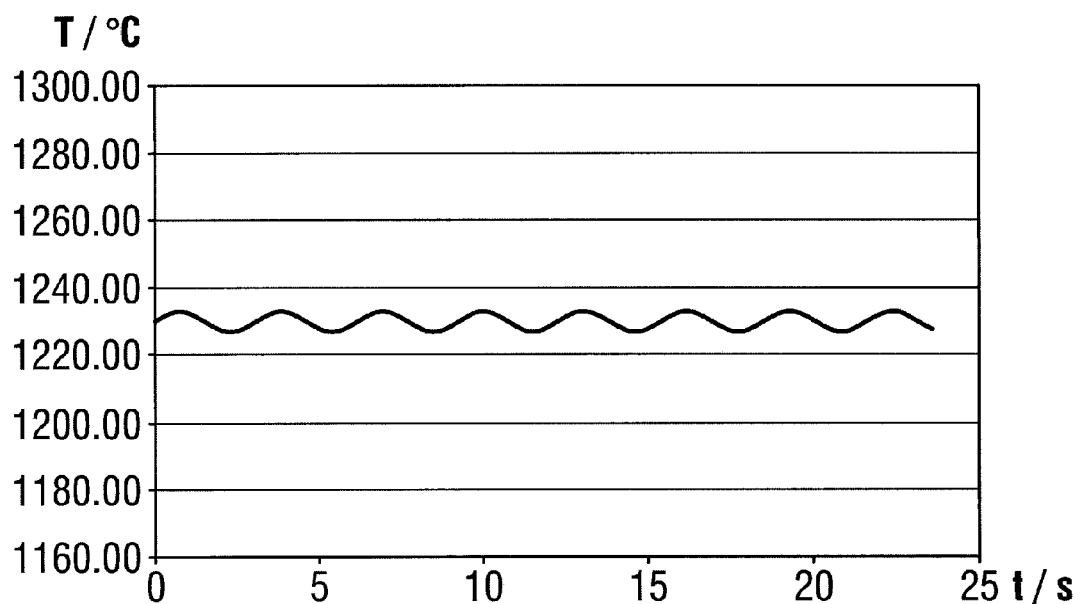
FIG. 5 shows the temporal profile of a temperature signal in the case of a semiconductor wafer ideally centered in the pocket.

FIG. 5 shows the temperature T (in degrees Celsius) measured according to the invention as a function of time t (in seconds) in the case of a silicon wafer positioned optimally in the pocket of a graphite susceptor coated with silicon carbide. The measured temperature fluctuates around an average value of approximately 1230° C. The amplitude is very small with a value of approximately 3 K since the proportions of area contributed by the susceptor and the silicon wafer in the measurement spot remain approximately constant during the rotation of the silicon wafer. Given an optimum position of the silicon wafer, the temperature fluctuation has an amplitude of just a few kelvins. The temperature deviation during the rotation of the susceptor is never zero even given an optimum position of the silicon wafer, since reflection and scattering of the radiation emitted by the infrared emitters also contribute to the measured temperature. In conjunction with a vertical wobble of the susceptor that cannot be completely avoided, this leads to a signal that oscillates with a small amplitude.

Figure 6:
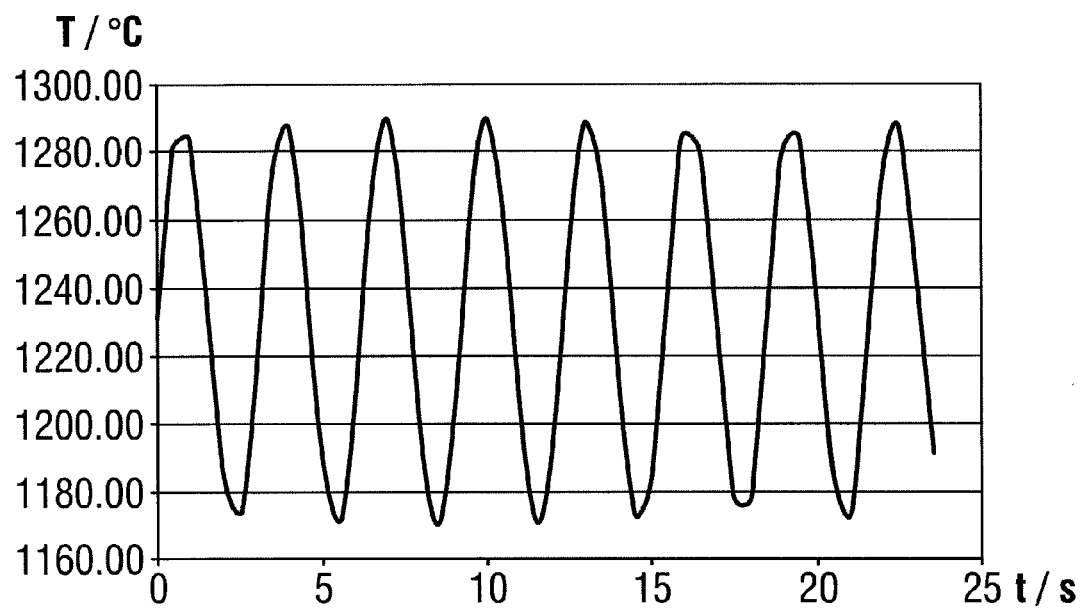
FIG. 6 shows the temporal profile of a temperature signal in the case of a semiconductor wafer lying eccentrically in the pocket.

FIG. 6 shows, by contrast, a temperature signal measured in the same way for the case of a silicon wafer lying as eccentrically as possible in the pocket. In this case, too, the average temperature is approximately 1230° C., but the amplitude, with a value of more than 50 K, is significantly larger than in the case of FIG. 5. This very large difference between the amplitudes in the case of an optimally positioned wafer and in the case of a silicon wafer bearing eccentrically on the edge of the susceptor permits a clear statement to be made about the position of the silicon wafer in the pocket. The larger the measured temperature fluctuation, the larger the error in the position.

According to the invention, a permissible maximum value is defined for the amplitude (or alternatively for the fluctuation range corresponding to twice the value of the amplitude). If the amplitude of the measurement signal generated by the pyrometer lies below the maximum value, a correct position of the semiconductor wafer is assumed. By contrast, if the maximum value is exceeded, an incorrect position of the semiconductor wafer, that is to say an eccentric position within the pocket of the susceptor, should be assumed.

The maximum value deemed to be permissible is dependent on a multiplicity of parameters (e.g. material of the susceptor, material of the semiconductor wafer, difference in diameter between pocket and semiconductor wafer, size and position of the measurement spot, detected wavelength, temperature of the thermal treatment, maximum permitted incorrect position of the semiconductor wafer) and can be determined for any configuration by means of suitable preliminary experiments. By way of example, a semiconductor wafer can intentionally be placed on the susceptor so eccentrically that its position is considered to be just still acceptable. Afterward, the thermal treatment is carried out with application of the method according to the invention and the amplitude of the measurement signal is determined. After cooling, the process chamber is opened and the exact position of the semiconductor wafer in the pocket of the susceptor is determined in order to be able to ascertain possible position changes. If the position of the semiconductor wafer also corresponds to the intended just still acceptable position after the thermal treatment, then the amplitude determined is defined as the maximum value. If the position of the semiconductor wafer has changed, the experiment has to be repeated, if appropriate.

In order to make the maximum value of the amplitude independent of the exact temperature of the thermal treatment and of the emissivity set at the pyrometer or in the evaluation unit, it may be expedient to define the maximum value in relation to the average value of the measurement signal of the pyrometer. By way of example, a maximum value could be defined which lies in the range of 1-4% of the average value of the measurement signal of the pyrometer during the relevant step of the thermal treatment.

For evaluation purposes, the pyrometer 7 (FIG. 4) is preferably connected to an evaluation unit 8, which evaluates the measurement signal of the pyrometer, if appropriate assigns a radiation temperature to the signal and records these values as a function of time in a data memory. However, it is also possible directly to record the measurement signal of the pyrometer as a function of time and to use it for the evaluation, without explicitly converting it into a temperature. (In the context of this description, however, the amplitudes of the pyrometer measurement signal are always expressed in units of temperature for reasons of comparability.) The measurement and storage of the measured values in the data memory can be effected either during the entire thermal treatment or at predetermined time intervals. In order to be able to evaluate the measurement signal in the simplest possible manner with regard to the amplitude or fluctuation range, the method according to the invention is preferably carried out during a phase of the thermal treatment in which the temperature is kept constant, that is to say not during a heating or cooling process.

The evaluation of the measurement signal generated by the pyrometer as a function of time can be effected, for example at predetermined time intervals, by means of a simple screen display in the manner of FIGS. 5 and 6 and assessment of the curve by visual inspection. Preferably, however, the evaluation is effected in an automated manner, for example by the evaluation unit. By way of example, a fault message indicating the existing problem can be issued at a suitable point.

It is also possible, by comparing the amplitudes from one semiconductor wafer to the next, to deduce the causes of an incorrect position and to initiate suitable measures:

a) If the amplitude (and thus in conclusion the position of the semiconductor wafer) changes severely from one semiconductor wafer to the next, then this may have been caused e.g. by a thermal shock when the semiconductor wafer was placed onto the susceptor, which resulted in a change in the position of the semiconductor wafer. Further causes may be floating on a gas cushion between susceptor and semiconductor wafer or vibrations caused by the pins as they are lowered. In this case, the affected semiconductor wafer can be marked and separated out or, if appropriate, be subjected to additional quality control checks.

b) If the fluctuation range slowly increases over a relatively long period of time, this may indicate a deteriorating positioning accuracy of an automatic transport device (e.g. a robot) that transports the semiconductor wafer into the process chamber. In this case, the movement of the transport device can be correspondingly corrected before the incorrect position becomes so pronounced that it adversely affects the quality of the treated semiconductor wafers.

If, in addition to the measurement signal of the pyrometer, a signal is recorded as a function of time which represents the current position of the susceptor during the rotation, then it is possible to calculate the location at which the semiconductor wafer lies too close to the edge of the susceptor, such that it is possible to exactly stipulate how the movements of an automatic transport device used for transporting the semiconductor wafer into the process chamber have to be corrected in order to achieve an optimum position of the semiconductor wafer again. By way of example, it is possible to calculate in which direction and by how many steps the stepper motors of a robot have to be adjusted.

The method according to the invention can be applied to all processes for thermal treatment of a semiconductor wafer in which the semiconductor wafer bears on a rotating susceptor whose emissivity differs from that of the semiconductor wafer, for example RTA or CVD processes. Particular preference is given to application in the context of the epitaxial coating of semiconductor wafers, in particular of silicon wafers.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for identifying an incorrect radial position of a semiconductor wafer to be thermally treated in a thermal treatment apparatus having a process chamber transmissive to infrared radiation, the semiconductor wafer having a radius $r^1$, and lying within a circular pocket of a rotating susceptor, the circular pocket having a center of radius and a radius $r^2$ greater than $r^1$, the semiconductor wafer heated by infrared radiation transmitted through the process chamber and maintained at a predetermined temperature by means of a control system, the method comprising:

providing a pyrometer having a measurement spot which lies partially on a peripheral surface of the semiconductor wafer and partially on a portion of the susceptor lying outside the semiconductor wafer, the emissivities of the semiconductor wafer and the susceptor being different;

measuring the amplitude of a fluctuating measurement signal from the pyromer obtained from a test semiconductor wafer which is centered with respect to the center of radius of the circular pocket or within an acceptable degree of eccentricity from being centered, to establish an acceptable maximum amplitude;

measuring the amplitude of a fluctuating signal from the pyrometer obtained from the semiconductor wafer to be thermally treated, and if the amplitude so measured exceeds the acceptable maximum amplitude, identifying the semiconductor wafer to be thermally treated as positioned radially incorrectly within the circular pocket, wherein the orientation of the measurement spot is such that from 10-90% of the area of the measurement spot lies on the test semiconductor wafer within a distance $r^1$ from the center of radius of the circular pocket.

2. The method of claim 1, wherein 20 to 60 percent of the area of the measurement spot lies on the test semiconductor wafer within a distance $r^1$ from the center of radius of the circular pocket.

3. The method of claim 1, wherein 30 to 40 percent of the area of the measurement spot lies on the test semiconductor wafer within a distance $r^1$ from the center of radius of the circular pocket.

4. The method of claim 1, wherein the acceptable maximum amplitude is defined in a range of one to four percent of the average value of the measurement signal.

5. The method of claim 1, wherein the thermal treatment is for the deposition of an epitaxial layer on the semiconductor wafer.

6. The method of claim 1, wherein each semiconductor wafer for which an incorrect position is determined is provided with a marking, indicating a suspected defective treatment, after the thermal treatment.

7. The method of claim 1, wherein, in addition to the measurement signal of the pyrometer, a signal is recorded for an incorrect radial position of a semiconductor wafer to be thermally treated as a function of time which represents the current position of the susceptor during its rotation, and wherein this data is used to correct the movements of an automatic transport device used for transporting the semiconductor wafer into the process chamber in order to avoid an incorrect position for the next semiconductor wafer.

8. The method of claim 1, wherein the semiconductor wafer is a silicon wafer, and the susceptor comprises silicon carbide.

9. The method of claim 1, wherein $r^1$ is 150 mm and $r^2$ is 151.5 mm, and the measurement spot has a diameter of 6-15 mm.

10. The method of claim 1, wherein $r^1$ is 150 mm and $r^2$ is 151.5 mm, and the measurement spot has a diameter of 9-12 mm.

11. The method of claim 1, wherein the amplitude of the fluctuating pyrometer measurement signal obtained from a centered test semiconductor wafer is approximately 3 K when the predetermined temperature of the wafer is 1230° C., and the amplitude of the fluctuating signal from a wafer to be thermally treated which is positioned within the pocket radially incorrectly such that one portion of the semiconductor edge contacts a wall of the circular pocket is 50 K or more.

* * * * *